(12) United States Patent
Copperthite

(10) Patent No.: US 7,537,149 B2
(45) Date of Patent: May 26, 2009

(54) DEEP ACCESS LARGE RIBBON BOND HEAD

(75) Inventor: Theodore J. Copperthite, Irvine, CA (US)

(73) Assignee: Orthodyne Electronics Corporation, Irvine, CA (US)

(*) Notice: Subject to any disclaimer, the term of this patent is extended or adjusted under 35 U.S.C. 154(b) by 246 days.

(21) Appl. No.: 11/528,299

(22) Filed: Sep. 26, 2006

(65) Prior Publication Data

US 2008/0073407 A1    Mar. 27, 2008

(51) Int. Cl.
*B23K 1/06*    (2006.01)
*B23K 37/00*    (2006.01)

(52) U.S. Cl. .......................... 228/1.1; 228/4.5
(58) Field of Classification Search ............. None
See application file for complete search history.

(56) References Cited

U.S. PATENT DOCUMENTS

| | | | |
|---|---|---|---|
| 3,687,787 A * | 8/1972 | Grand, III | 156/507 |
| 4,340,166 A * | 7/1982 | Bilane et al. | 228/180.5 |
| 4,387,001 A * | 6/1983 | Burns et al. | 156/495 |
| 4,489,873 A * | 12/1984 | Yoshida et al. | 226/162 |
| 4,490,199 A * | 12/1984 | Dunning | 156/73.4 |
| 4,527,730 A * | 7/1985 | Shirai et al. | 228/180.5 |
| 5,148,959 A * | 9/1992 | Cain et al. | 228/4.5 |
| 5,207,854 A * | 5/1993 | Becking | 156/350 |
| 5,614,057 A * | 3/1997 | Conley et al. | 156/354 |
| 6,089,439 A * | 7/2000 | Yamazaki et al. | 228/4.5 |
| 6,321,974 B1* | 11/2001 | Tsuchiya et al. | 228/110.1 |
| 6,439,448 B1* | 8/2002 | Ringler | 228/110.1 |
| 6,471,116 B2* | 10/2002 | Copperthite | 228/180.5 |
| 6,513,696 B1* | 2/2003 | Ho et al. | 228/4.5 |
| 2005/0087585 A1 | 4/2005 | Copperthite et al. | 228/180.5 |
| 2006/0219672 A1* | 10/2006 | Ruben et al. | 219/121.6 |
| 2006/0278682 A1* | 12/2006 | Lange et al. | 228/4.5 |

FOREIGN PATENT DOCUMENTS

JP        200735827 A   *   2/2007

* cited by examiner

*Primary Examiner*—Kiley Stoner
(74) *Attorney, Agent, or Firm*—Haynes and Boone, LLP.

(57) ABSTRACT

A ribbon bond head capable of deep access bonding is configured to pass the bonding ribbon outside the transducer, e.g., in front of the transducer, instead of through the transducer. A clamping mechanism includes a stationary flat clamp base and a movable clamp arm with an opening, where the bonding ribbon passes through, not around, the clamp arm. The ribbon is clamped between the movable clamp and the stationary clamp and held securely during looping.

11 Claims, 3 Drawing Sheets

DEEP ACCESS LARGE RIBBON BOND HEAD

BACKGROUND

1. Field of Invention

The present invention relates generally to ribbon bonding systems and, in particular, to bond heads for such systems.

2. Related Art

In the manufacture of semiconductor devices, active elements in a semiconductor device, such as drain and/or source regions in a semiconductor die, are electrically connected to other devices or electronic components, such as on a printed circuit board. Typically, the connection is made by bonding, e.g., ultrasonically bonding, a conductive wire between the two portions. Examples of electrical connections which can be made using wire bonding techniques include connections between the contact surfaces of discrete or integrated chips and the contact leads of their packages, and, in the case of hybrid circuits, the connections between inserted monolithic elements and the film circuit which contains them.

A number of bonding techniques have been developed, and one which has been particularly successful is a micro-welding technique using ultrasound. Conductive wire, in contact with the surface to which it is to be bonded, is moved rapidly in the direction of the surface to which it is to be bonded, so that its oxide layer breaks open. The wire is then subjected to pressure, and a permanent joint is created between the two materials. Motion of the wire is generated by an ultrasonic transducer excited by an ultrasonic generator to produce high-frequency mechanical vibrations.

One type of ultrasonic bonding uses a wedge bonding tool. The ultrasonic energy is directed to the wire by the wedge tool. The wire is fed through a guide at the bottom of the wedge. The wire is then pressed down with a small defined force to slightly deform the wire. Ultrasonic energy is then switched on, and the bonding process starts. During this time, the wire portion under the bond tool is deformed, primarily widened, with the actual change in shape depending on the size and the physical properties of the wire, the bond tool geometry, and the process parameter settings.

In addition to wires, flexible conductive ribbons can be used to electrically connect two bonding areas. Compared to round wires, wide and thin ribbons allow bonding larger cross sections and creating larger contact areas. Ultrasonic bonding can also be used to connect the ribbon to a bonding surface. Ribbon bonding is disclosed in commonly-owned U.S. Patent Publication No. 20040217488, filed May 2, 2003, which is hereby incorporated by reference in its entirety.

A typical bond head for ribbon bonding includes a transducer with a slot through which the ribbon passes. A clamping mechanism, such as two opposing clamp arms, holds the ribbon near the bonding area. In operation, the ribbon passes through the slot in the transducer, where it is held by the two opposing clamp arms. The bond head is brought down onto the ribbon and the bonding surface with ultrasonic energy to bond the ribbon to the bonding surface.

This type of bond head has certain disadvantages. Because the ribbon can be very wide, e.g., 80 mil or wider, the slot necessarily has to be very wide. Wide slots may require the transducer to be re-designed, especially if the slot is near the same width or greater than the diameter of the transducer cone. The ribbon can also easily rub against the slot, especially when the ribbon and slot are comparable in size. As a result, the ribbon can be damaged or subject to unnecessary wear. Another disadvantage is with the clamping mechanism. Since the ribbon passes between the two clamp arms, it is difficult for the user to access the ribbon for deep access bonding. If the faces of the clamp arms are not as wide as the ribbon, the ribbon may not be clamped securely, thereby possibly comprising the quality of the bond or damaging the ribbon.

Therefore, there is a need for a bond head that overcomes the disadvantages of conventional ribbon bond heads discussed above.

SUMMARY

According to one aspect of the invention, a ribbon bond head assembly includes a ribbon guide tube connected to the bond head, where the ribbon exits the guide tube, passes through the bond head and by the transducer. Thus, the ribbon does not pass through a slot in the transducer, but rather passes outside the transducer. The ribbon head assembly also includes a clamping assembly comprised of a stationary body having a planar portion against which one side of the ribbon contacts and an opposing movable clamp arm having an open interior portion and a planar end portion for clamping the ribbon against the stationary body. This enables the user easy access to the ribbon from the front, yet still allows relatively long, narrow sections to be secured near the tip of the bond tool for deep access bonding. In another embodiment, the clamping assembly has a stationary body and a stationary clamp arm, with a separation between the two sufficient to allow the ribbon to freely move through the clamp, but not so wide such that the ribbon can be twisted and turned.

These and other features and advantages of the present invention will be more readily apparent from the detailed description of the preferred embodiments set forth below taken in conjunction with the accompanying drawings.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
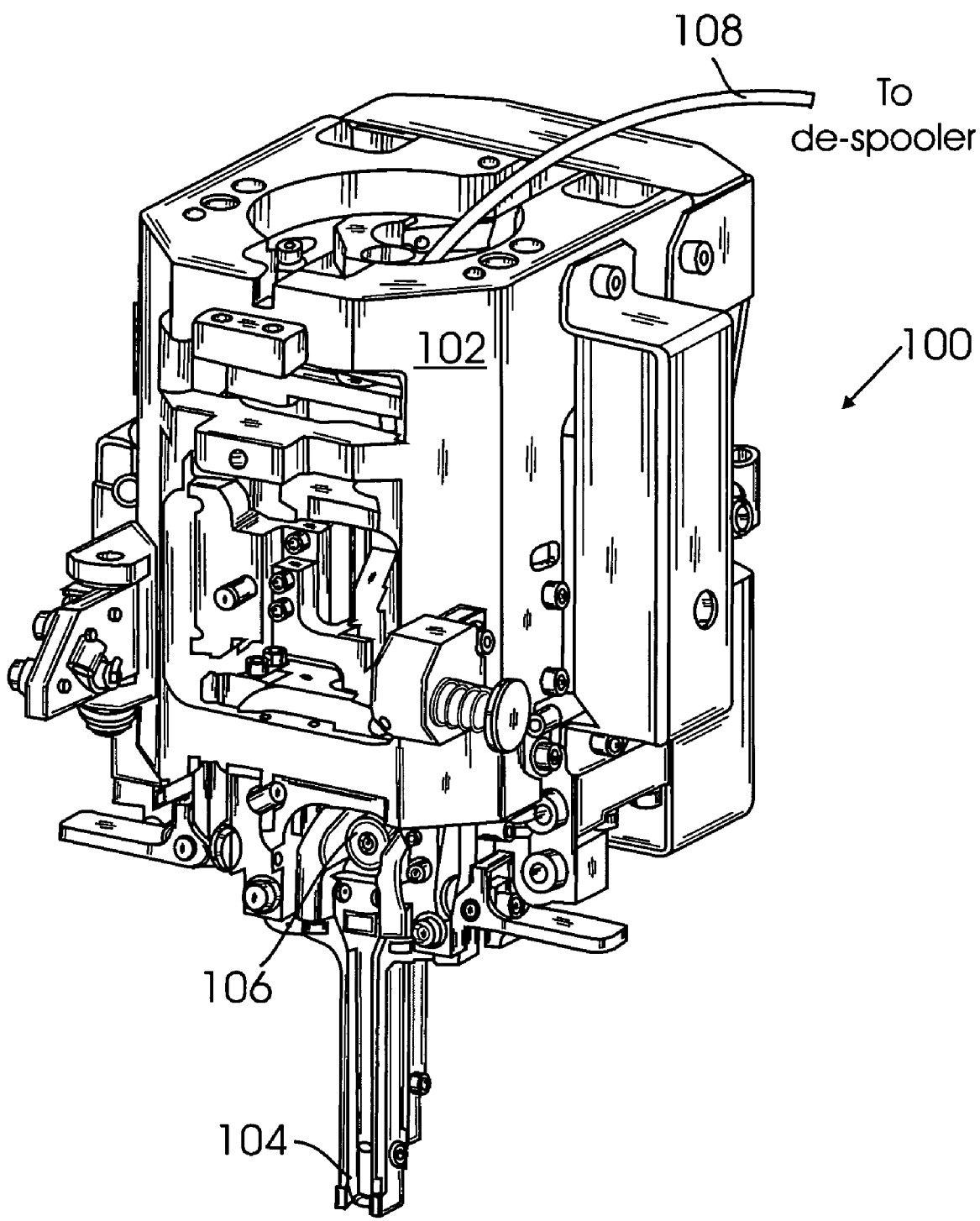
FIG. 1 shows a ribbon bond head assembly according to one embodiment of the present invention.

FIG. 1 shows a portion of a ribbon bond head assembly 100 according to embodiment of the present invention. Bond head assembly 100 includes a primary mounting 102 which is connected to circuitry and other elements of a bonding system (conventional and not shown) to enable primary mounting 102 to move in the necessary directions for a bonding process, such as the Z-direction (up and down), X-Y directions, or rotationally. Primary mounting 102 is coupled to a clamp 104, a bond head (not shown), and a cutter (not shown). A transducer 106 is located above the bond head. Bond head assembly 100 also includes a ribbon guide tube 108 having one end coupled to primary mounting 102 and the other end coupled to a ribbon de-spooling system (not shown).

A flexible conductive ribbon passes through an opening in ribbon guide tube 108 from the de-spooling system out to bond head assembly 100, where it passes through bond head assembly 100, in front of transducer 106, and down to clamp 104. Clamp 104 holds the ribbon for bonding to electrically connect two elements, such as a die and an external lead in a package. The connection to the die is by ultrasonic bonding in one embodiment. Bonding of the lead may also be by ultrasonic bonding. The ribbon is of a rectangular cross-section and can be of a single layer, such as aluminum or copper, or can be of multiple layers, such as a thin aluminum bonding layer underlying a thicker copper conducting layer. In some embodiments, a single ribbon is used, while in other embodiments, multiple parallel ribbons are bonded.

The size of the ribbon can be of different widths and thicknesses. For example, the width of the ribbon may range from 20 mil to 100 mil or more. In one embodiment, the width is 120 mil. Larger width ribbons generally are able to replace larger numbers of wires. The thickness of the ribbon may range from 2 mil to 10 mil or more, although lower thicknesses may be possible with improved equipment and processes. In one embodiment, the thickness is 12 mil. Some typical sizes for the ribbon are 20 mil×2 mil, 20 mil×4 mil, 30 mil×3 mil, 40 mil×4 mil, 50 mil×5 mil, 60 mil×8 mil, 80 mil×6 mil, 80 mil×8 mil, 80 mil×10 mil, and 100 mil×10 mil.

In operation, according to one embodiment, ribbon is fed from the de-spooler, passing outside transducer 106, and clamped near a bonding area by clamp 104. A portion of the ribbon is then pressed against the bonding area by the bond head, such as a wedge tool, to deform the ribbon. Ultrasonic energy from transducer 106 is applied to the ribbon, thereby forming the bond. The bond head is then moved to the next bonding area or a cutter is brought down onto the ribbon to cut the ribbon.

Figure 2:
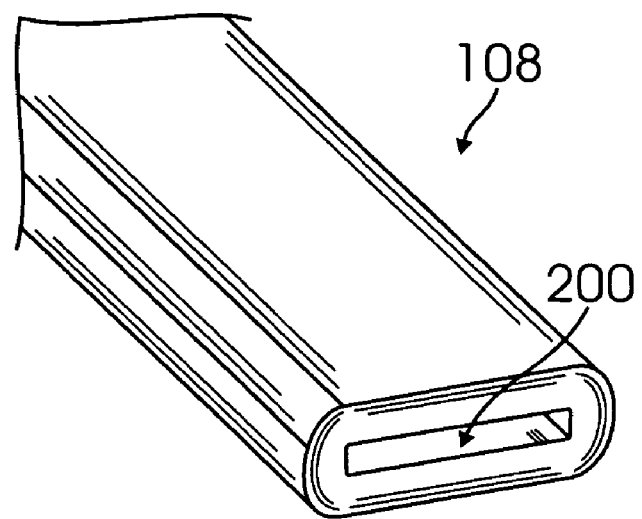
FIG. 2 shows a portion of a ribbon guide tube for use with the assembly of FIG. 1.

FIG. 2 shows a portion of ribbon guide tube 108. Tube 108 is rectangular shaped and has a rectangular shaped opening 200 through which the ribbon passes. In one embodiment, the size of opening 200 is made to accommodate the largest ribbon used for the ribbon bonding system. For example, if the ribbon bonding system can utilize a 100 mil×10 mil ribbon, the opening is at least that size. In other embodiments, the size of the opening is customized to a specific ribbon size. The guide tube can be made from a flexible material, such as plastic or rubber. Guide tube 108 protects and guides the ribbon as it travels from a ribbon de-spooler to the bond head.

Figure 3:
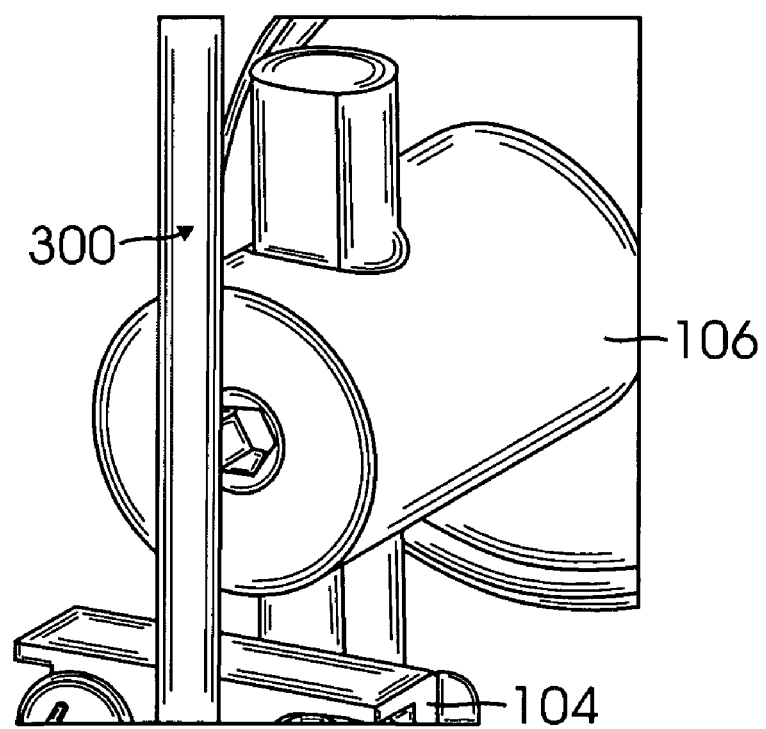
FIG. 3 shows a portion of a transducer and ribbon from the assembly of FIG. 1.

FIG. 3 shows the transducer portion of the bond head of FIG. 1. A conductive ribbon 300, which has exited the ribbon guide tube, passes outside of transducer 106. In one embodiment, ribbon 300 passes approximately 1 mm in front of transducer 106, although other distances are also suitable. As a result, no slot is needed through transducer 106. This simplifies design of the transducer, as well as providing greater flexibility to the system. For example, one type of transducer can be used for ribbons of different widths and thicknesses. In conventional ribbon bonding systems, transducers have a fixed slot, which may not be able to handle wide ribbons. Also, ribbons may be damaged or unnecessarily worn as they pass through the slot. After passing by transducer 106, ribbon 300 is secured by clamp 104.

Figure 4:
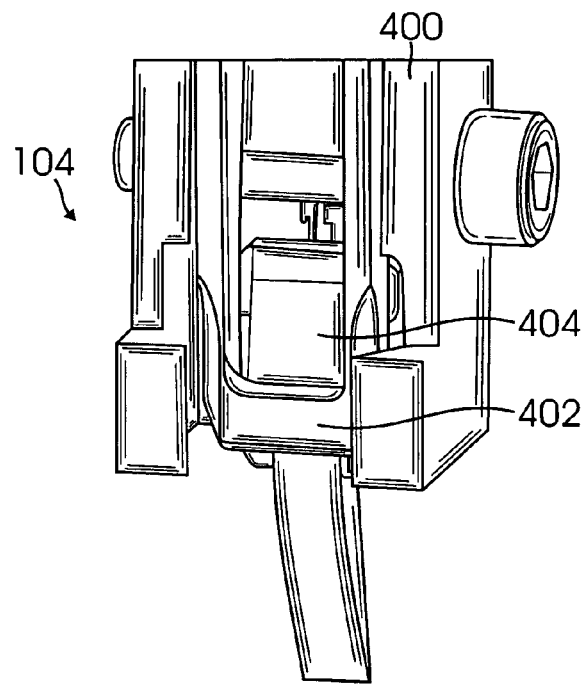
FIG. 4 shows a portion of a ribbon clamp from the assembly of FIG. 1.
Figure 5:
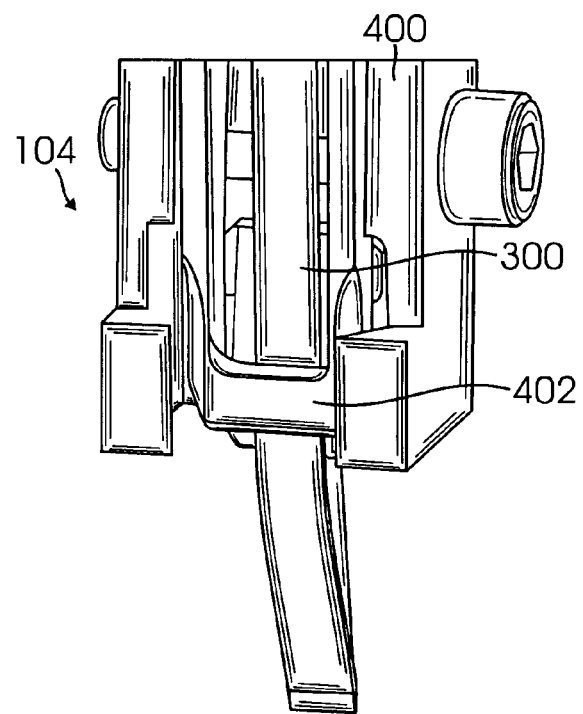
FIG. 5 shows a portion of the ribbon clamp of FIG. 4 with a ribbon.

FIGS. 4 and 5 shows a portion of clamp 104, where FIG. 4 shows the clamp without a ribbon and FIG. 5 shows the clamp with a ribbon. In FIG. 4, clamp 104 includes a main body 400 extending down from the transducer to the bond tool (not shown). A movable front-facing clamp arm 402 is pressed against a stationary flat clamp base 404. For example, a motor can be used to cause clamp arm 402 to exert force against clamp base 404. In other embodiments, clamp arm 402 can also be stationary with a fixed or adjustable separation from clamp base 404. The amount of separation is such that the ribbon can freely pass between the clamping surfaces, yet not so wide that the ribbon can be twisted and turned. For example, for ribbon thicknesses between 2 mil and 10 mil, the separation distance can be approximately 12 mil, which even for a 20 mil wide ribbon will prevent such a ribbon from twisting within the clamping region.

As shown in FIG. 4, clamp arm 402 has an opening through which the ribbon passes towards the clamp base 404. The opening allows the user to access the ribbon from the front. In one embodiment, the opening is rectangular shaped, although other shapes may also be suitable, such as oval. Clamp arm 402 has a flat surface opposing a flat surface on clamp base 404. The width of both flat surfaces is, in one embodiment, at least as wide as the widest ribbon used for the ribbon bonding system. This ensures that any size ribbon intended for use with the system will have its complete width "clamped". Clamp base 404 also has an extension (ribbon guide section) extending from the flat surface toward a bond tool or wedge (not shown).

FIG. 5 shows conductive ribbon 300 clamped by clamp 104. As seen, ribbon 300 is secured against the flat surface of clamp base 404 by clamp arm 402. The opening in clamp arm 402 allows ribbon 300 to pass through, not around, from the front to the back of arm 402. As the bond head is moved during the bonding process, the ribbon moves against the ribbon guide section. The ribbon is then placed near the bonding area, where the bond tool is brought down and ultrasonically bonds the ribbon to the bonding area. The bond head then moves to the next bonding area and creates a loop in the ribbon for the next bond.

Accordingly, the clamps enable the ribbon to be constrained during a looping operation so that a repeatable loop shape is obtained. The clamps hold the end or free "tail" of the ribbon in a correct location when moving to the next bonding position. The opening in the movable clamp arm gives the user easy access to the ribbon from the front, yet still allows relatively long, narrow sections down to near the tip of the bond tool or wedge.

The above-described embodiments of the present invention are merely meant to be illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

What is claimed is:

1. A ribbon bond head, comprising:
    a main body;
    a ribbon guide tube having a first end coupled to the main body and a second end coupled to a ribbon source, wherein the ribbon guide tube has an opening to enclose and pass through a conductive ribbon;
    a transducer coupled to the main body;
    an opening in the main body in front of the transducer, wherein the ribbon passes through the opening and in front of the transducer; and
    a clamp coupled to the main body, wherein the clamp comprises:
        a clamp arm having a width at least as wide as the ribbon; and
        a stationary clamp base having a width at least as wide as the ribbon.

2. The bond head of claim 1, wherein the clamp arm is movable.

3. The bond head of claim 1, wherein the clamp arm has an opening through which the ribbon passes.

4. The bond head of claim 1, wherein the clamp arm has a flat surface biased against an opposing flat surface on the stationary clamp base.

5. The bond head of claim 1, wherein the opening in the ribbon guide tube is approximately rectangular.

6. The bond head of claim 1, wherein the opening in the main body allows the ribbon to pass approximately 1 mm from the front of the transducer.

7. The bond head of claim 1, wherein the clamp is coupled with the transducer.

8. The bond head of claim 1, wherein the bonding ribbon is at least 2 mil thick.

9. The bond head of claim 1, wherein the bonding ribbon is at least 20 mil wide.

10. The bond head of claim 1, wherein the stationary clamp base has provisions for holding a ribbon guide which extends from the clamp base toward a bond tool.

11. The bond head of claim 10, wherein the extension portion of the ribbon guide is narrowed to the approximate width of the bond tool.

\* \* \* \* \*